US012598989B2

(12) United States Patent
Liu et al.

(10) Patent No.: US 12,598,989 B2
(45) Date of Patent: Apr. 7, 2026

(54) PACKAGE STRUCTURES WITH PATTERNED DIE BACKSIDE LAYER

(71) Applicant: Intel Corporation, Santa Clara, CA (US)

(72) Inventors: Pilin Liu, Chandler, AZ (US); Feras Eid, Chandler, AZ (US); Michael Baker, Gilbert, AZ (US); Wenhao Li, Chandler, AZ (US); Zhaozhi Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 17/710,507

(22) Filed: Mar. 31, 2022

(65) Prior Publication Data

US 2023/0317545 A1     Oct. 5, 2023

(51) Int. Cl.
*H01L 23/367*     (2006.01)
*H01L 23/00*      (2006.01)
*H01L 23/373*     (2006.01)

(52) U.S. Cl.
CPC ........ *H01L 23/367* (2013.01); *H01L 23/3732* (2013.01); *H01L 24/08* (2013.01); *H01L 24/09* (2013.01); *H01L 24/16* (2013.01); *H01L 24/17* (2013.01); *H01L 24/81* (2013.01); *H01L 2224/0801* (2013.01); *H01L 2224/08113* (2013.01); *H01L 2224/0903* (2013.01); *H01L 2224/09104* (2013.01); *H01L 2224/10155* (2013.01); *H01L 2224/16013* (2013.01); *H01L 2224/16014* (2013.01); *H01L 2224/16057* (2013.01); *H01L 2224/16227* (2013.01); *H01L 2224/16237* (2013.01); *H01L 2224/16238* (2013.01); *H01L 2224/1703* (2013.01); *H01L 2224/17051* (2013.01); *H01L 2224/17132* (2013.01); *H01L 2224/17133* (2013.01); *H01L 2224/81203* (2013.01); *H01L 2924/3511* (2013.01); *H01L 2924/37001* (2013.01)

(58) Field of Classification Search
None
See application file for complete search history.

(56)     References Cited

U.S. PATENT DOCUMENTS

| | | | |
|---|---|---|---|
| 5,641,946 A | | 6/1997 | Shim |
| 5,698,068 A | | 12/1997 | Ichikawa et al. |
| 5,744,863 A | * | 4/1998 | Culnane ............... H01L 23/367 |
| | | | 257/E23.087 |

(Continued)

FOREIGN PATENT DOCUMENTS

| | | |
|---|---|---|
| CN | 1753160 A | 3/2006 |
| JP | 2006066566 A | 3/2006 |
| JP | 2010067922 A | 3/2010 |

*Primary Examiner* — Long Pham
(74) *Attorney, Agent, or Firm* — Essential Patents Group, LLP

(57)     ABSTRACT

Microelectronic die package structures formed according to some embodiments may include a substrate and a die having a first side and a second side. The first side of the die is coupled to the substrate, and a die backside layer is on the second side of the die. The die backside layer includes a plurality of unfilled grooves in the die backside layer. Each of the unfilled grooves has an opening at a surface of the die backside layer, opposite the second side of the die, and extends at least partially through the die backside layer.

13 Claims, 17 Drawing Sheets

(56)            References Cited

U.S. PATENT DOCUMENTS

| | | | |
|---|---|---|---|
| 6,623,577 B2 | 9/2003 | Ogawa et al. | |
| 7,019,407 B2 | 3/2006 | Chen et al. | |
| 7,455,213 B2 | 11/2008 | Nishiyama | |
| 7,736,459 B2 | 6/2010 | Matsumura | |
| 8,177,862 B2 | 5/2012 | Hwang et al. | |
| 8,556,158 B2 | 10/2013 | Jang et al. | |
| 8,604,614 B2 | 12/2013 | Kwon et al. | |
| 8,716,853 B2 | 5/2014 | Do et al. | |
| 8,925,608 B2 | 1/2015 | Mayr | |
| 9,318,455 B2 | 4/2016 | Lin et al. | |
| 9,603,262 B2 | 3/2017 | Hojo et al. | |
| 9,780,076 B2 | 10/2017 | Yew et al. | |
| 9,875,985 B2 | 1/2018 | Nah et al. | |
| 10,553,548 B2 | 2/2020 | Neal et al. | |
| 10,957,649 B2 * | 3/2021 | Cheah | H10D 62/117 |
| 11,139,626 B2 | 10/2021 | Sato | |
| 11,515,171 B2 | 11/2022 | Qu et al. | |
| 11,607,741 B2 | 3/2023 | Choi et al. | |
| 11,881,446 B2 * | 1/2024 | Fan | H01L 25/50 |
| 11,935,866 B2 | 3/2024 | Lin et al. | |
| 2005/0061856 A1 | 3/2005 | Maki et al. | |
| 2008/0035274 A1 | 2/2008 | Kanisawa | |
| 2013/0334708 A1 | 12/2013 | Kwon et al. | |
| 2014/0072774 A1 | 3/2014 | Kito et al. | |
| 2014/0265165 A1 | 9/2014 | Lin et al. | |
| 2015/0171048 A1 | 6/2015 | Yasuyoshi et al. | |
| 2017/0186721 A1 | 6/2017 | Kira et al. | |
| 2020/0350277 A1 | 11/2020 | Lin et al. | |
| 2021/0098415 A1 | 4/2021 | Lee et al. | |
| 2021/0384042 A1 | 12/2021 | Qu et al. | |
| 2024/0222318 A1 | 7/2024 | Lin et al. | |

* cited by examiner

200

112          106

107

120          105          104

112

112

112

106

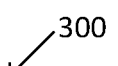
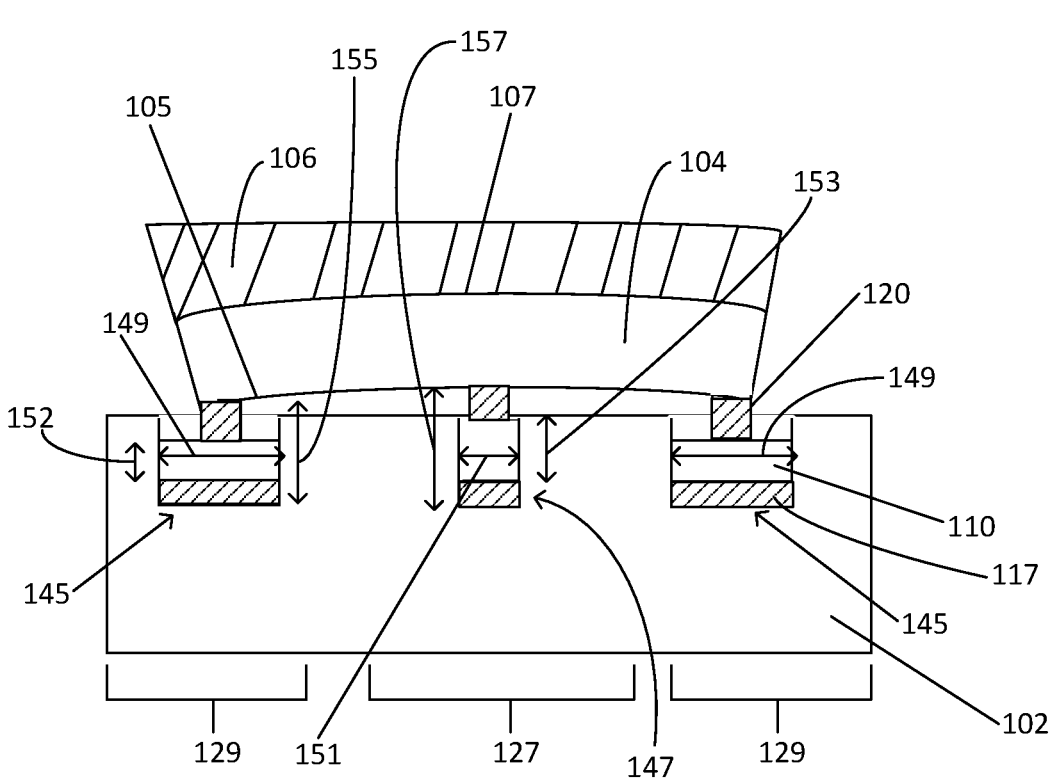
FIG. 3A

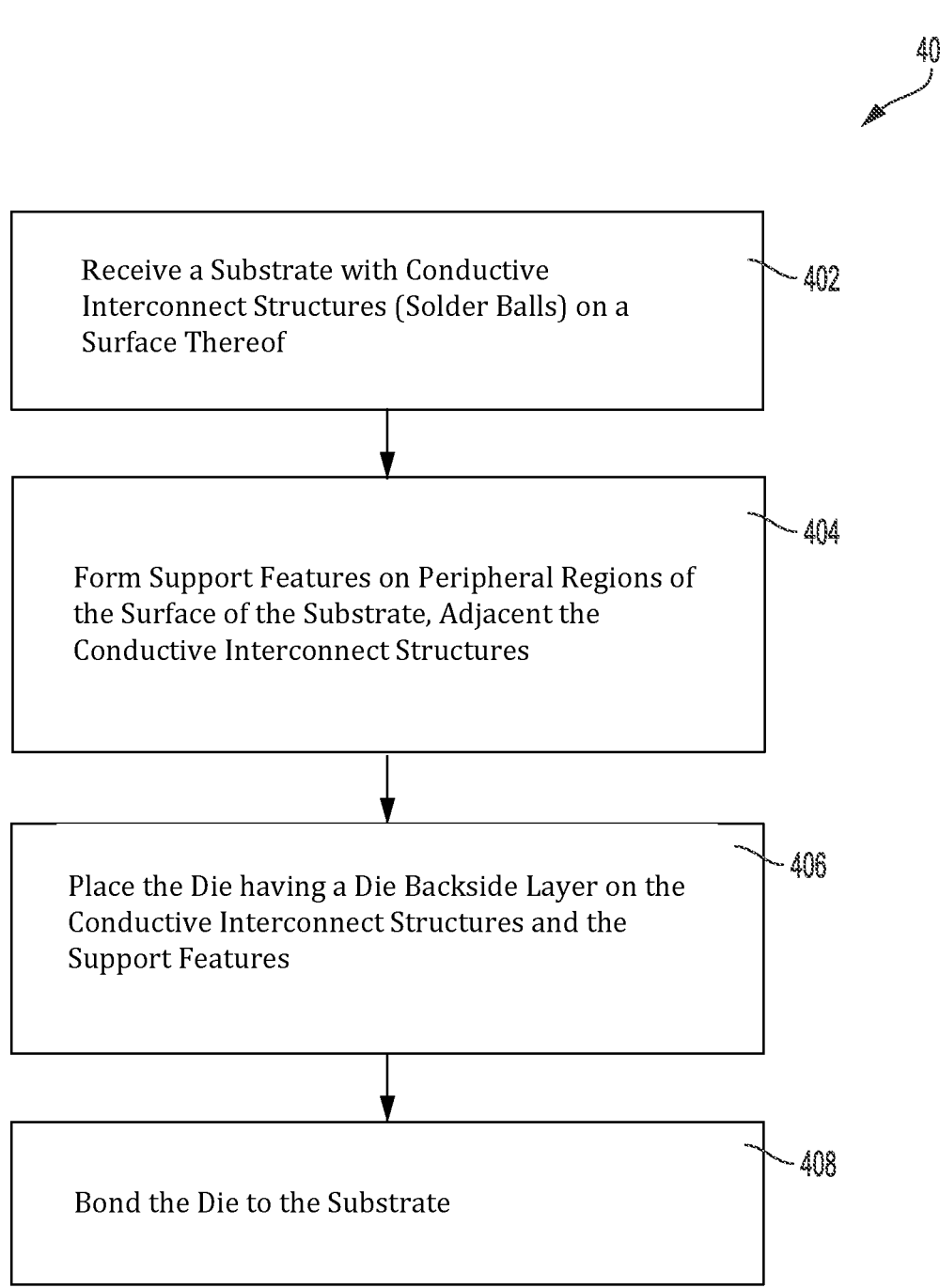

400

Receive a Substrate with Conductive Interconnect Structures (Solder Balls) on a Surface Thereof ~ 402

Form Support Features on Peripheral Regions of the Surface of the Substrate, Adjacent the Conductive Interconnect Structures ~ 404

Place the Die having a Die Backside Layer on the Conductive Interconnect Structures and the Support Features ~ 406

Bond the Die to the Substrate ~ 408

FIG. 4

PACKAGE STRUCTURES WITH PATTERNED DIE BACKSIDE LAYER

BACKGROUND

In electronics manufacturing, integrated circuit (IC) packaging is a stage of manufacture where an IC that has been fabricated on a die or chip comprising a semiconducting material is coupled to a supporting case or "package" that can protect the IC from physical damage and support electrical interconnect suitable for further connecting to a host component, such as a printed circuit board (PCB). In the IC industry, the process of fabricating a package is often referred to as packaging, or assembly.

Die back side layers, either metallic or composite, may exhibit high thermal conductivities and thus can benefit package heat dissipation and facilitate warpage control during surface mounting of the package to a board, such as a PCB. However, the use of thicker die backside layers (with thicknesses on the order of tens to hundreds of microns) may impose unique challenges during chip assembly process, such as during thermal compression bonding (TCB).

For example, the die backside layers may possess a coefficient of thermal expansion (CTE) that is larger than that of silicon. This CTE mismatch can result in die warpage during TCB, which may induce a "frowning face" shape, i.e. the die edges may touch the substrate before the center. Failures can occur due to this warpage, such as solder bridging at die corners and/or joint opens forming at die center regions.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A-3D illustrate cross-sectional views of microelectronic package structures comprising non-uniform structures, in accordance with some embodiments.

FIG. 4 illustrates a flow chart of a process that includes forming microelectronic package structures comprising support features, in accordance with some embodiments.

DETAILED DESCRIPTION

Figure 1A:
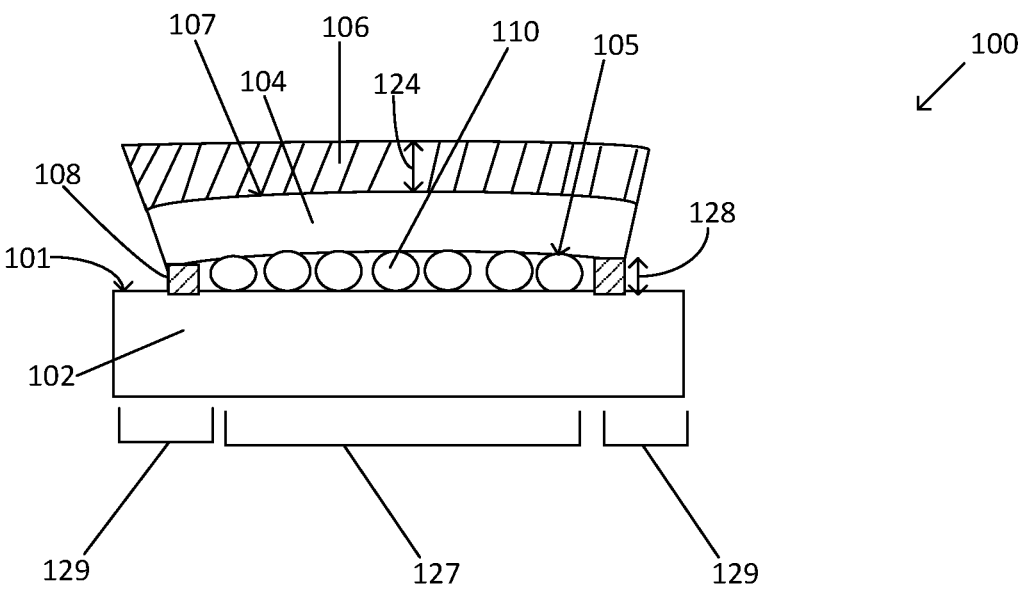
FIGS. 1A-1F illustrate cross-sectional views and top views of microelectronic package structures comprising support features, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the explicit context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments discussed herein may address problems associated with deploying the die backside layers. For example, such die backside layers, which are advantageously deployed for benefits of heat dissipation and warpage control during surface mount operations, may possess a coefficient of thermal expansion (CTE) that is larger than that of silicon, or other materials deployed in a die. This CTE mismatch can result in die warpage during TCB and other problems, which lead to failures inclusive of solder bridging at die corners and/or joint opens at die center regions.

Embodiments of forming patterned die backside layers within package structures to mitigate warpage during assembly processing, such as thermal compression bonding (TCB), for example, are described herein. Microelectronic die package structures formed according to some embodiments include a die having a first side and a second side. The first side of the die is coupled to the substrate, and a die backside layer is on the second side of the die. The die backside layer includes a plurality of unfilled grooves in the die backside layer. Each of the unfilled grooves has an opening at a surface of the die backside layer, opposite the second side of the die, and extends at least partially through the die backside layer. As used herein, the term die backside layer indicates a relatively thick layer on the backside of a die for heat dissipation and warpage control.

Discussion begins with embodiments related to collapse control features for use during TCB. In some embodiments, the collapse control features are mechanically stronger than the solder features, particularly at elevated temperatures. In some embodiments, the collapse control features are of a material having a greater Young's modulus than the solder features. In some embodiments, the Young's modulus of the collapse control feature material is twice that of the solder features. In some embodiments, the Young's modulus of the collapse control feature material is five times that of the solder features. In some embodiments, the Young's modulus of the collapse control feature material is ten times that of the solder features. In addition or in the alternative, in some embodiments, the melting point of the collapse control feature material is greater than that of the solder features.

The microelectronic die package structures described herein may be assembled and/or fabricated with one or more of the features or attributes provided in accordance with various embodiments. A number of different assembly and/ or fabrication methods may be practiced to generate die package structures having one or more of the features or attributes described herein.

FIGS. 1A-1F depict the formation of microelectronic die package structures comprising support/collapse control features according to embodiments herein. FIG. 1A is a cross-sectional view of portions of a die package structure 100 formed according to some embodiments herein. A substrate 102 may comprise a package substrate to which any number of dies may be placed upon, in some embodiments. The substrate 102 may comprise conductive material with dielectric material interspersed within the substrate 102. The substrate 102 may additionally comprise integrated circuitry fabricated according to any suitable microelectronic technology such as complementary metal oxide semiconductor (CMOS), SiGe, III-V or III-N HEMTs, etc.) techniques or others. For example, substrate 102 may include any active or passive devices. A surface 101 of the substrate 102 may comprise a central region 127 and a peripheral region 129.

The substrate 102 may comprise conductive interconnect structures 110 on the surface 101 of the substrate 102. As used herein, the term conductive interconnect structure indicates any structure or conductive element for coupling to an outside die or other device. In an embodiment, the conductive interconnect structures 110 may comprise an array of solder structures. For example, the conductive interconnect structures 110 may be solder balls. As used herein, the term solder balls indicates an interconnect structure prior to or after reflow. The solder structures may comprise one or more of silver, tin, copper, and combinations thereof. As shown, one or more support features 108 are between the surface 101 of the substrate 102 and the die 104. One or more support features 108 may be on the surface 101 of the substrate 102 in the peripheral region 129 of the substrate 102. The support features 108 may be on peripheral portions of a first side 105 of a die 104 or on peripheral portions of the surface 101 of substrate 102, such that the support features 108 are between the peripheral portions of the die 104 and the peripheral portions 129 of the surface 101 of the substrate 102 after TCB. The support features 108 provide mechanical support to the die 104. In an embodiment, a height 128 of the support features 108 may be between about 1 micron to about 50 microns. In an embodiment, the one or more support features may comprise column, square, block or line geometries. In some embodiments, the height 128 of support features 108 is approximately the same as the height of the conductive interconnect structures 110.

The die 104 may comprise any appropriate die/device, including, but not limited to, a microprocessor, a chipset, a graphics device, a wireless device, a memory device, an application specific integrated circuit, a transceiver device, an input/output device, combinations thereof, stacks thereof, or the like. The first side 105 of the die 104 is on the conductive interconnect structures 110 which are communicatively coupled thereto. The conductive interconnect structures 110 are adjacent the support features 108. A die backside layer 106 is on a second side 107 of the die 104. The die backside layer 106 may comprise a metallic or a composite material and may comprise a material with a high thermal conductivity. The die backside layer 106 provides heat dissipation and warpage control during assembly of the package to the board, such as during a surface mount process of the package 100 onto a board. In an embodiment, the surface mount process may comprise a reflow process, as is known in the art.

In some embodiments, the die backside layer 106 may comprise at least one of copper, aluminum, silver, gold, diamond materials, aluminum nitride, silicon carbide or combinations thereof. In some embodiments, the die backside layer 106 may comprise a thickness 124 between about 50 microns to about 500 microns. In some embodiments, an optional thin middle layer (as depicted in FIG. 2E for example) may be between the die back side layer 106 and the die 104. In some embodiments, the optional intermediate layer may act as a diffusion barrier, or may provide a buffer layer, and may protect the die 104 during formation of the die backside layer 106.

Figure 1B:
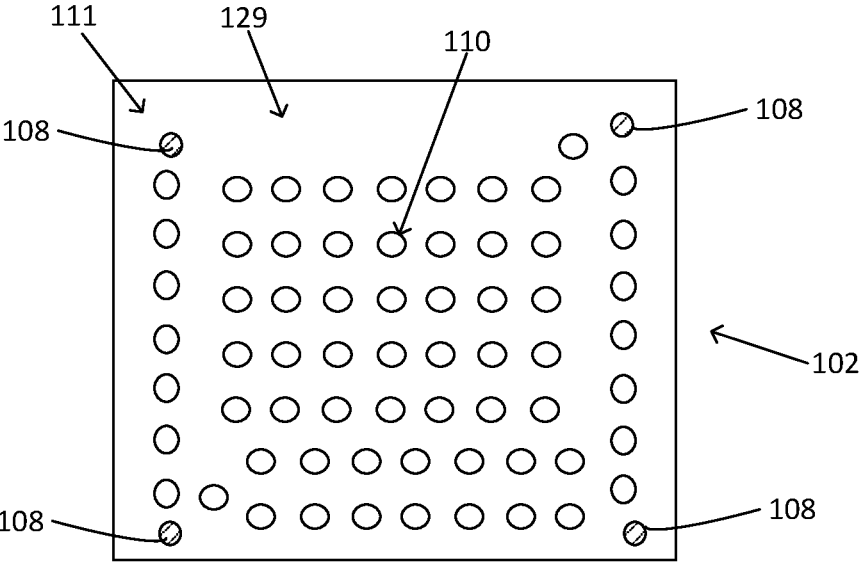

In FIG. 1B, a top view of the substrate 102 surface comprising support features 108 is depicted. In some embodiments, the one or more support features 108 may be located in peripheral regions 129 of the substrate 102. For example, peripheral regions 129 may be a region at or near an outer edge of the substrate 102 and/or at or near the outermost conductive interconnect structures 110. Notably, the peripheral regions 129 may include conductive interconnect structures 110. In some embodiments, the support features 108 may be located in corner regions 111 of the peripheral region 129 of the substrate 102, adjacent to the one or more conductive interconnect structures 110. Corner regions 111 may be defined in a manner similar to that of peripheral regions 129 such that the corner regions are at or near outer corners of the substrate 102. The die 104 may have peripheral regions and corner regions analogous to peripheral regions 129 and corner regions 111.

In some embodiments, the one or more support features 108 may comprise polymer materials, such as epoxy materials, polyimide or resin materials, or may comprise composite dielectric materials, for example. In some embodiments, the support features 108 provide thermal stability and mechanical strength, wherein a Young's modulus of the support features 108 may be above about 1 GPa at a TCB bonding temperature (such as between about 200 degrees Celsius to about 340 degrees Celsius, for example). For example, the support features 108 may provide additional mechanical support and may be made of polymeric or composite dielectrics. In some embodiments, the support features 108 are engineered solder balls having a core made of a stiffer metal (e.g., copper) to prevent excessive collapse, as discussed further herein with respect to FIGS. 1E and 1F.

In some embodiments, the support features 108 may comprise a spherical shape. In some embodiments, the one or more support features 108 may comprise one or more of a microscale block or line/rectangular shape adjacent the outermost conductive interconnect structures 110. In some embodiments, the support features 108 may be formed by utilizing photolithographic and/or ink jet printing processes, as are known in the art.

The conductive interconnect structures 110 may comprise a plurality of solder balls in some embodiments. In some embodiments, the one or more support features 108 provide a collapse control structure since they reduce die warpage at peripheral regions of the die 104 thus preventing solder ball bridging underneath the die 104 during thermal processing, such as during TCB. Additionally, the support features 108 prevent joint opens (conductive interconnect structures 110 opens) from forming between the central region of the die 104 and the substrate 102 which may occur due to coefficient of thermal expansion (CTE) differences between silicon and the die backside layer 106.

Figure 1C:
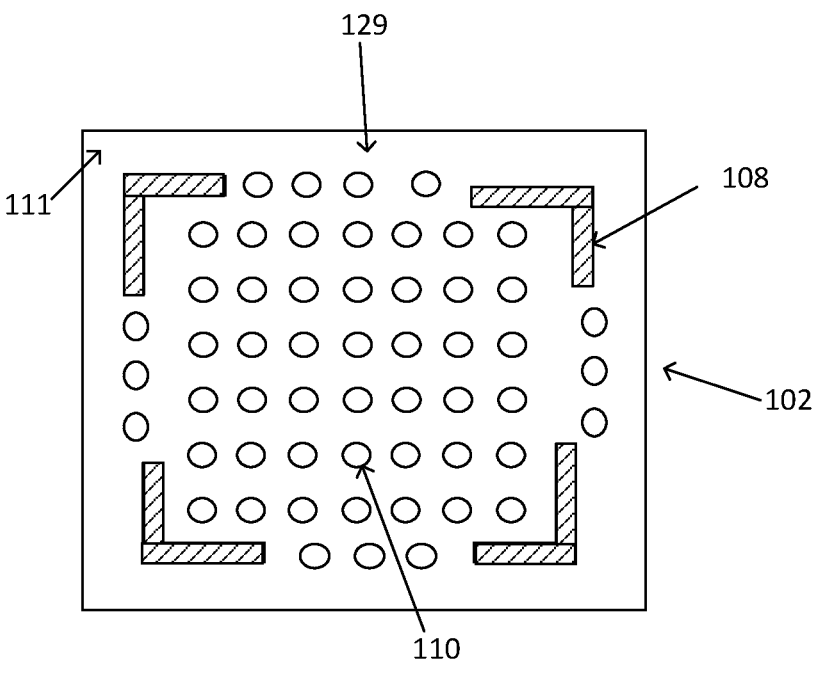

FIG. 1C depicts a top view according to some embodiments of the substrate 102 wherein the one or more support features 108 comprise an "L" shape and are located in corner regions 111 of the peripheral region 129 of the substrate 102. As shown, in some embodiments, support features 108 each include two orthogonal segments that meet at corner region 111 and extend away from their intersection point along orthogonal edges of the substrate 102. The number, exact shape and location of the one or more support features 108 may vary depending upon the particular application optimization requirements to reduce/eliminate die warpage during thermal processing.

Figure 1D:
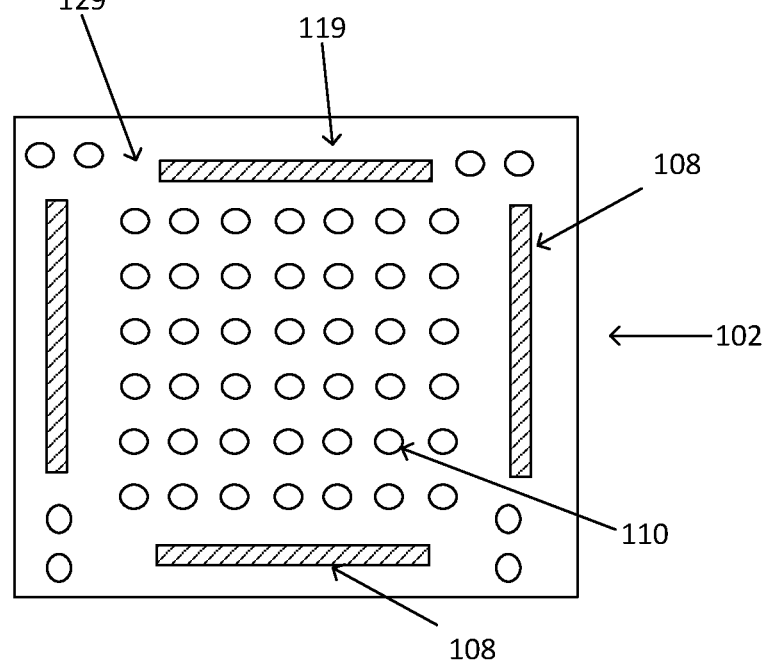

FIG. 1D depicts a top view of the substrate 102 according to some embodiments wherein the one or more support features 108 comprise a rectangular shape and are located on edge regions 119 (and substantially non-corner regions in some embodiments) of the peripheral region 129 of the substrate 102. As shown, in some embodiments, support features 108 are provided along edges of the substrate 102 and in the peripheral regions 129. For example, a support feature 108 may be provided along each of the four edges of the substrate with support features 108 on opposing edges having about the same length. In such embodiments, the corner regions may advantageously include conductive interconnect structures 110. For example, one or more conductive interconnect structures 110 may be adjacent the edge aligned support features 108.

Figure 1E:
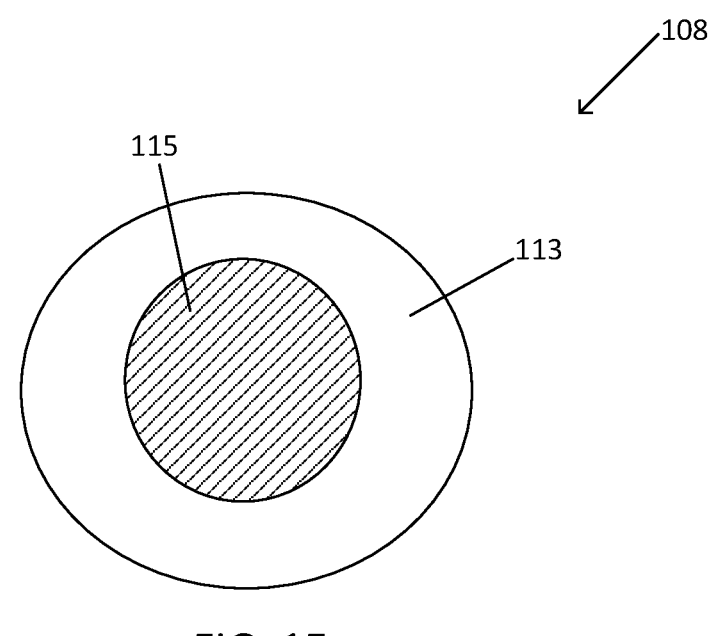

FIG. 1E depicts a cross-sectional view of an embodiment of the one or more support features 108, wherein the one or more support features 108 comprises a spherical shape having a first portion 113 (e.g., outer portion) surrounding a second portion 115 (e.g., inner portion) such that the second portion 115 is a stiffer material than the first portion 113. The first portion 113 and the second portion 115 may be any suitable materials such that the second portion is a stiffer material to provide mechanical support. In some embodiments, the first portion 113 of the support feature 108 comprises a solder material, such as a tin, or silver copper solder (SAC), and the second portion 115 of the support feature 108 comprises a core material that is stiffer than the first portion material 113. In some embodiments, the second portion 115 may comprise a metal material such as copper or an alloy of copper.

Figure 1F:
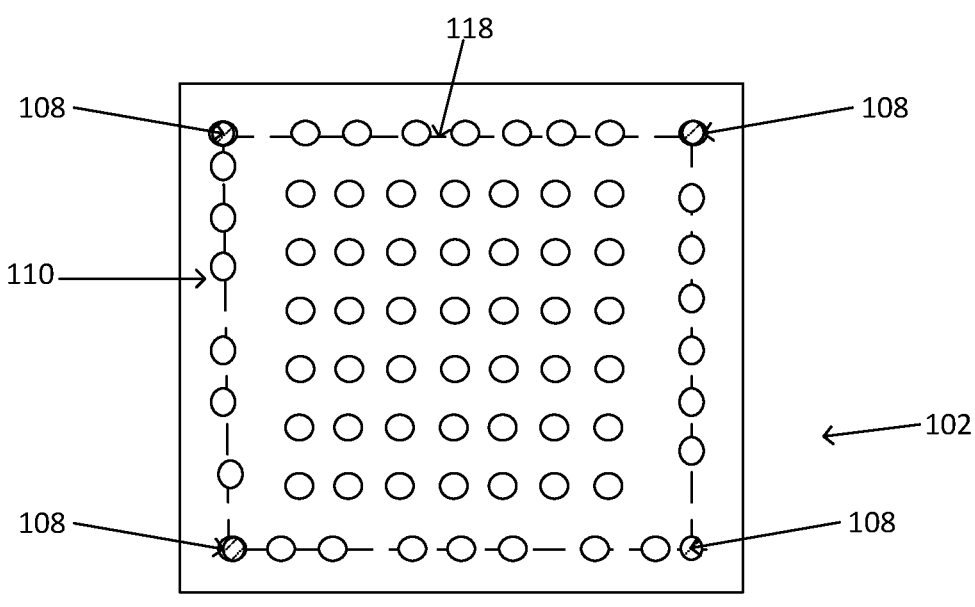

FIG. 1F depicts a top view of the substrate 102 according to some embodiments wherein support features 108 comprising a stiff center (as depicted in FIG. 1E) may be located in at least one outermost corner of an array of conductive interconnect structures 110. In some embodiments, the support features comprising the stiff center may be located in any suitable position in the outermost positions (as depicted by the dotted line 118) of the array of conductive interconnect structures 110. In some embodiments, the support features 108 comprising a stiff core provide both electrical connection and mechanical support. The number and location of stiff core support features 108 can vary according to warpage reduction requirements for a particular package design. In some embodiments stiff centered support features 108 may be placed in all four outermost corners. In other embodiments, stiff centered support features 108 can be placed at any desired location, or more than one stiff centered support feature 108 may be used at each desired location on the substrate 102. In some embodiments since the core of the stiff centered support features possesses larger stiffness and a greater melting point than solder material, the core portion 115 prevents solder bridging failure during TCB processing.

As discussed, embodiments address problems associated with deploying the die backside layers inclusive of die warpage during TCB, which lead to failures inclusive of solder bridging at die corners and/or joint opens at die center regions. Discussion now turns to embodiments related to patterning the die backside layer(s) to mitigate such issues during TCB.

Figure 2A:
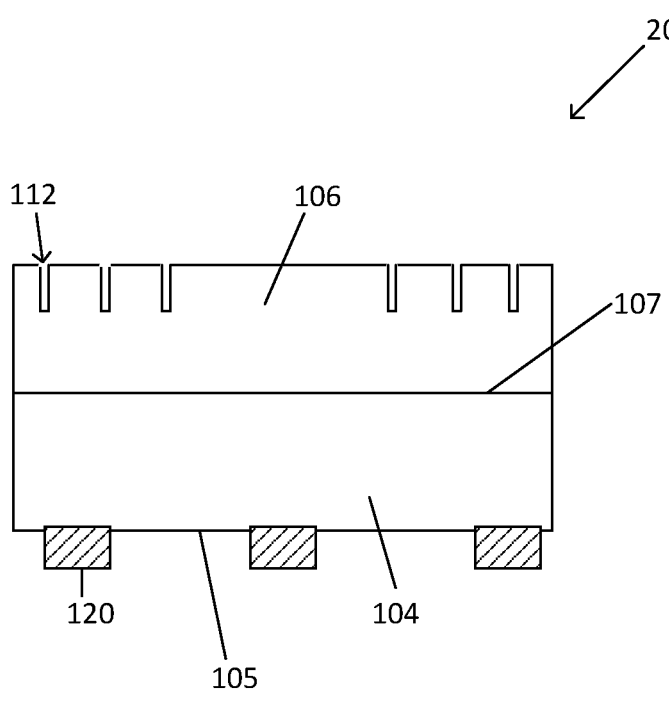
FIGS. 2A-2I illustrate cross-sectional views and top views of microelectronic package structures comprising die backside layer openings, in accordance with some embodiments.
Figure 2B:
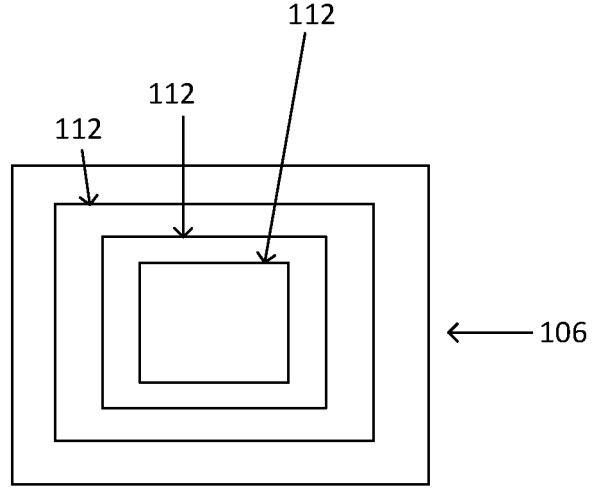
Figure 2C:
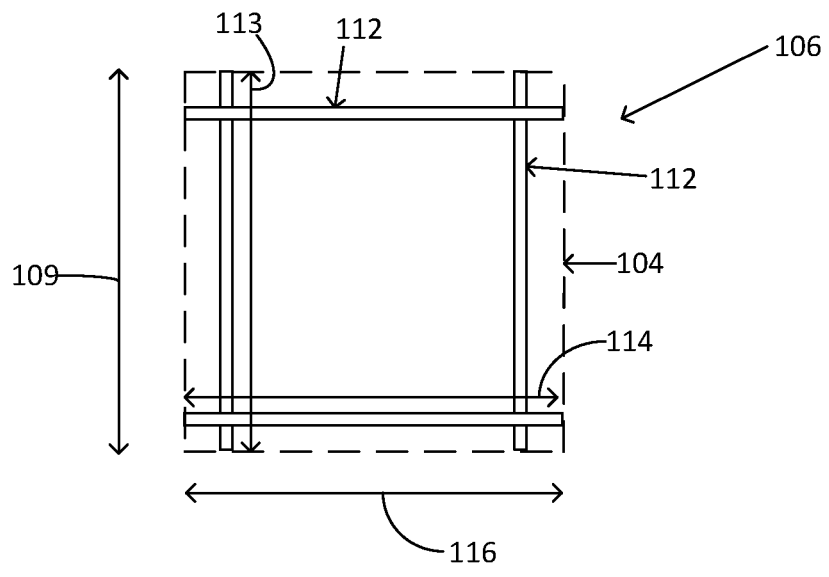
Figure 2D:
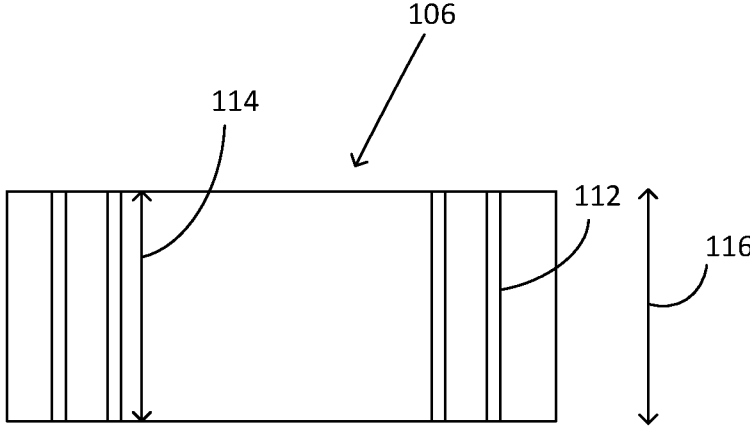
Figure 2E:
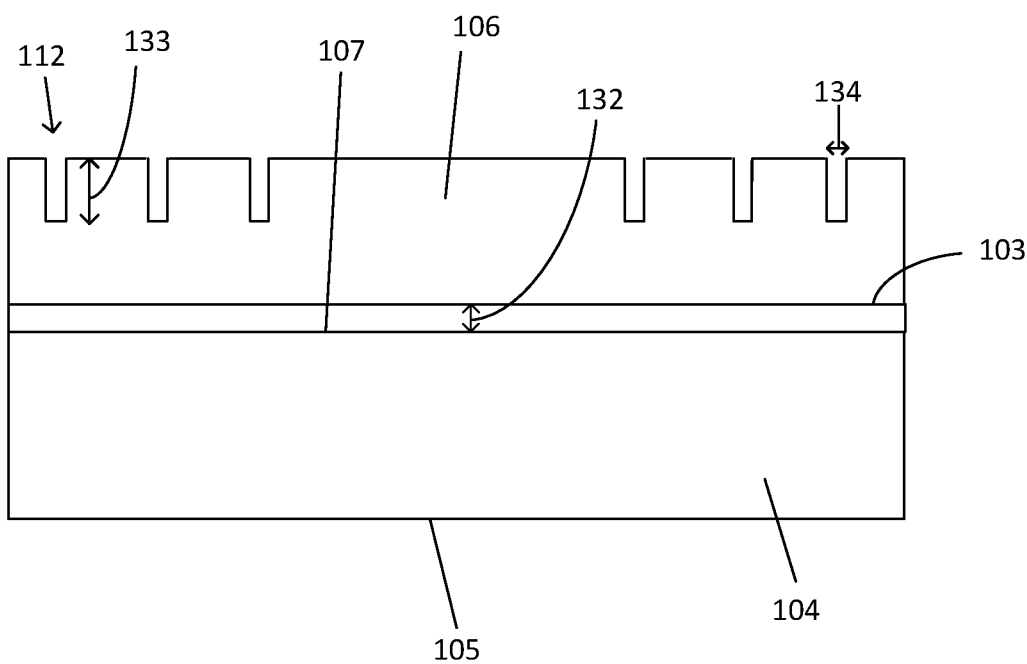

FIGS. 2A-2I depict the formation of microelectronic die package structures comprising a patterned die backside layer according to embodiments herein. FIG. 2A depicts a cross-sectional view of a portion of a die package structure 200 comprising a die 104, the die 104 comprising a first side 105 and a second side 107. A die backside layer 106 may be on the second side 107 of the die 104. Die pads 120 may be on the first side 105 of the die 104. One or more openings 112 may extend at least partially through the die backside layer 106.

Since the CTE of the die backside layer 106 may be larger than the CTE of silicon or other material(s) of die 104, a convex warpage of the die may occur during TCB processing, where the die 104 edges may contact a substrate before the center of the die contacts the substrate. This increases the risk of solder bridging at the die corners and/or joint opens formation at the die 104 center. The one or more openings/grooves 112 may be optimized to reduce warpage of the die 104 during TCB processing. For example, openings 112 shapes, dimensions and/or depth may be optimized (based on metal and dielectric layer design rules in some cases) for a particular package structure to reduce warpage. For a particular back side layer 106 thickness, a designed pattern of openings can modulate the effective compliance of the film to reduce warpage during TCB. As used herein, the term unfilled groove or opening indicates a groove or opening absent the bulk material of the die backside layer 106. The unfilled groove or opening may be filled with air, an ambient, or other material.

FIG. 2B depicts a top view of the die backside layer 106 comprising concentric patterned openings 112 extending at least partially through the die backside layer 106. In some embodiments, openings 112 may be formed/patterned in the die backside layer 106 by utilizing such processes as laser ablation, etching, or other suitable patterning processes as are known in the art. As shown, in some embodiments, openings 112 are provided such that each is around a center or central region of the die 104. Such openings may be spaced apart by the same distance or by differing distances. In the illustrated example, enclosed rectangular patterns (i.e., in top down view) are shown but other patterns, enclosed or not, may be deployed.

In FIG. 2C, a top view of the die backside layer 106 is depicted with the periphery of the underlying die 104 shown as dashed lines. The one or more openings 112 may comprise substantially straight lines that extend across a length 109 and/or a width 116 of the die 104. In some embodiments, a first length 113 of an opening 112 may be substantially the same as the length 109 of the die 104. A second length 114 of an opening 112 may be substantially the same as the width 116 of the die 104. In some embodiments, openings 112 intersect at or near corner regions of the die 104. In some embodiments, the openings 112 may be formed by utilizing a die-saw, plasma etching, or laser ablation process that cuts only into the die backside layer 106 and does not cut into the die 104.

FIG. 2D depicts a top view of the die backside layer 106 according to some embodiments. In FIG. 2D, the one or more openings 112 comprise a length 114 that is substantially the same as a width 116 of the underlying die 104. In various embodiments, openings 112 are provided in orthogonal directions (as shown in FIG. 2E) parallel to one another (as shown in FIG. 2D). In some embodiments, openings 112 are provided parallel to edges of the die 104.

In some embodiments, openings 112 are provided at angles (e.g., a 45° angle) relative to the edges of the die 104.

FIG. 2E depicts a cross-sectional view of a portion of a package structure according to some embodiments. A die 104 comprises a first side 105 and a second side 107. An intermediate layer 103 is between the second side 107 of the die 104 and the die backside layer 106. The intermediate layer 103 may comprise a thickness 132 of between about 10 nm to about 500 nm in some embodiments. The intermediate layer 103 may optionally be between the die 104 and the die backside layer 106 of any of the embodiments herein. In some embodiments, the intermediate layer 103 may comprise one or more of titanium, nickel, vanadium, gold, a metal or inorganic nitride, or combinations thereof.

In some embodiments, one or more openings 112 may extend partially through the die backside layer 106, but do not contact the intermediate layer 103. In some embodiments, the one or more openings 112 comprise a depth 133 and a width 134 which can be optimized in order to reduce warpage that may occur during TCB processing temperatures. In some embodiments, depth 133 is in the range of one-third to two-thirds of the thickness of the die backside layer 106. In some embodiments, depth 133 is about one-half of the thickness of the die backside layer 106.

Figure 2F:
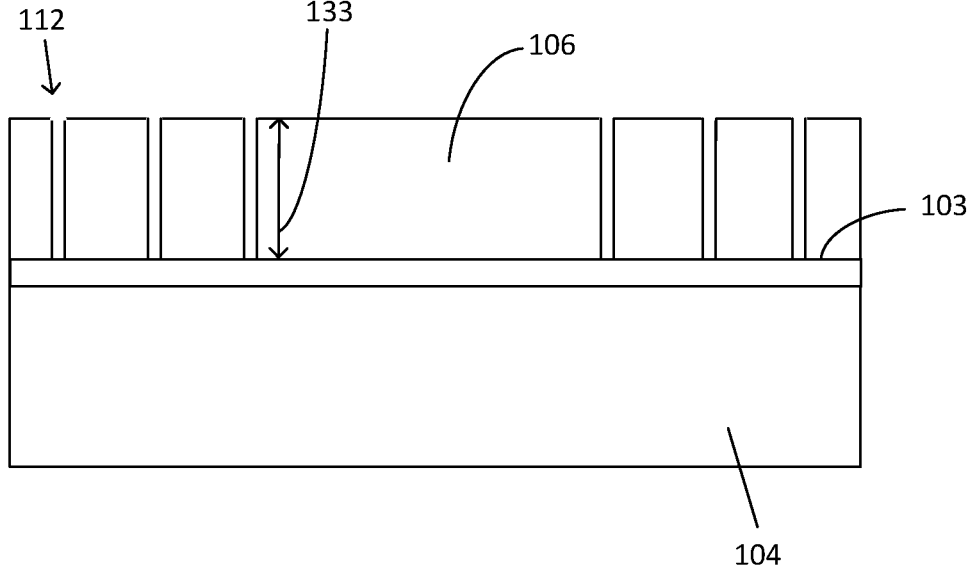

FIG. 2F depicts an embodiment in which a depth 133 of the one or more openings 112 extends completely through the die backside layer 106 and ends at the interface between the die backside layer 106 and the intermediate layer 103.

Figure 2G:
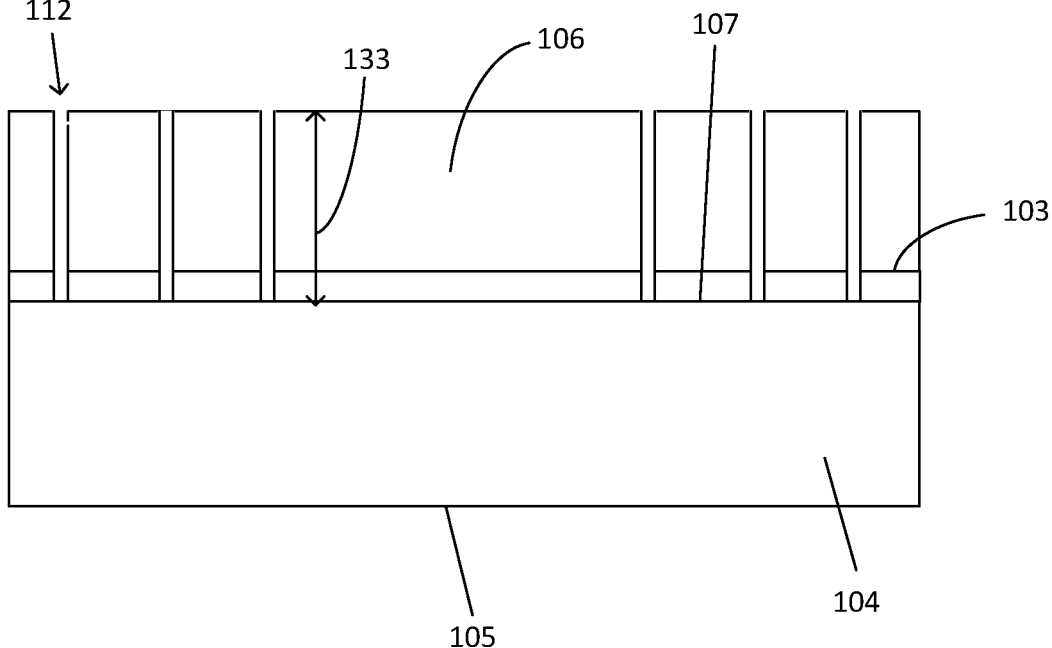

FIG. 2G depicts an embodiment in which a depth 133 of the one or more openings 112 may extend completely through the die backside layer 106 and completely through the intermediate layer 103, such that the one or more openings 112 terminate at the second side 107 of the die 104.

Figure 2H:
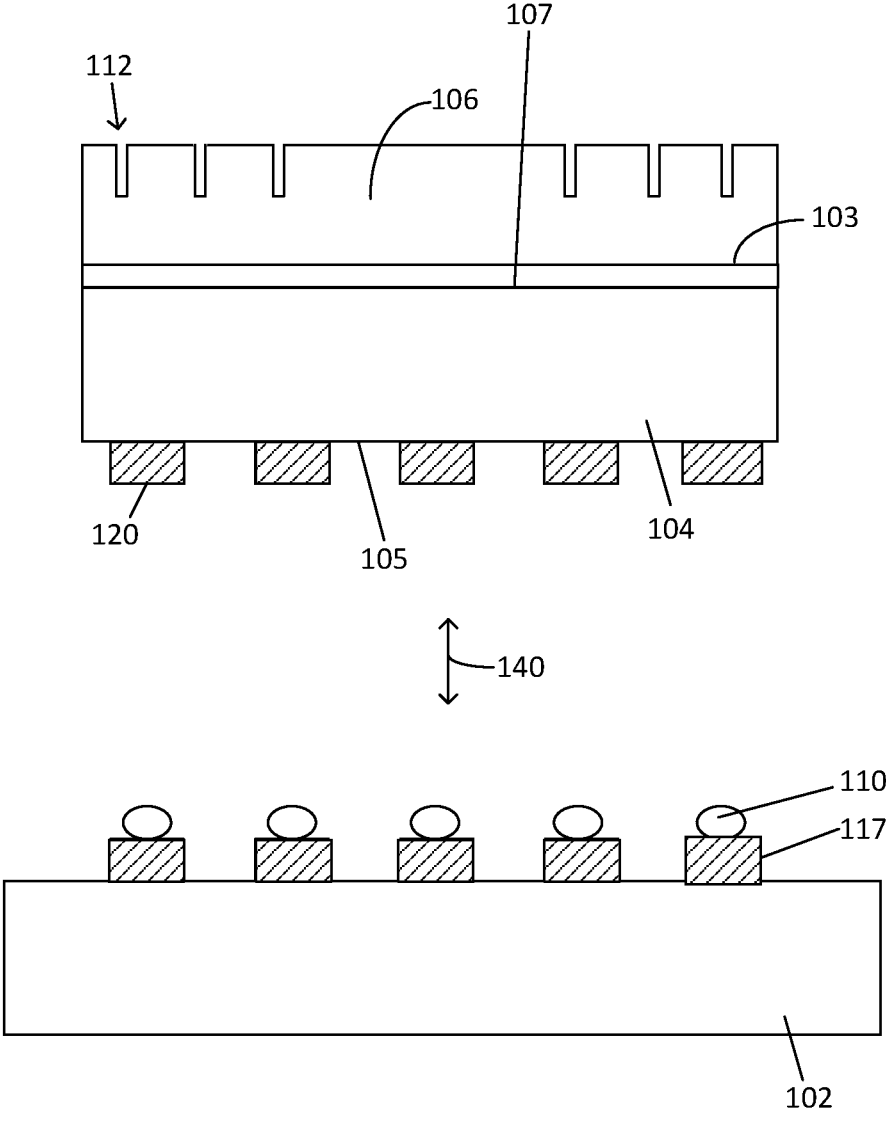
Figure 2I:
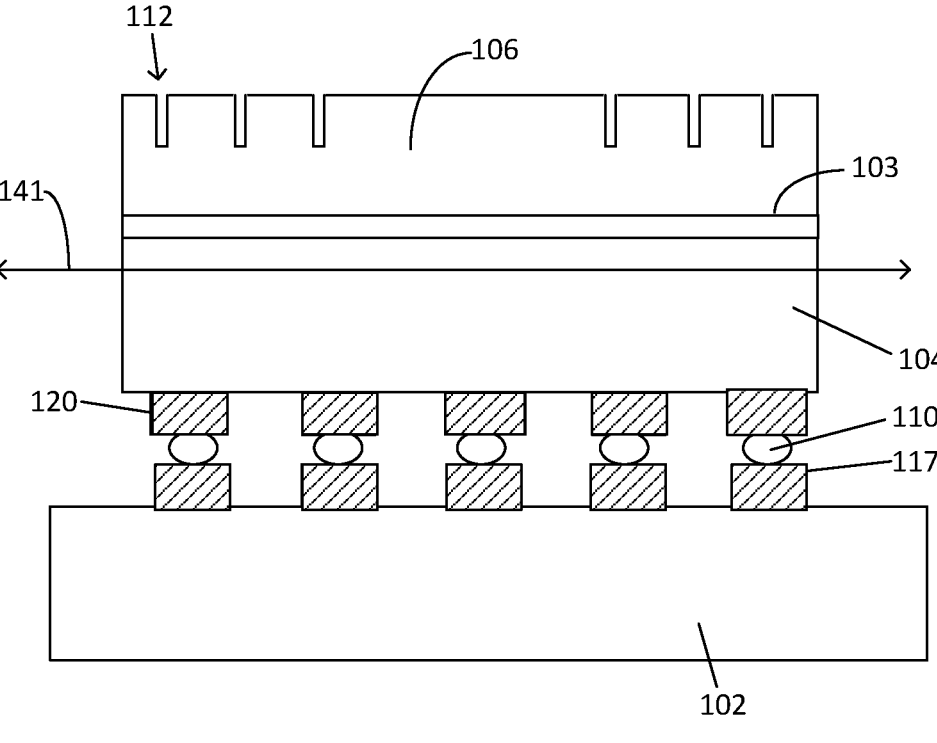

FIGS. 2H-2I depict a process wherein a die 104 may be bonded to a substrate 102 utilizing a TCB process 140, according to some embodiments. In FIG. 2H, a second side 107 of the die 104 comprises a die backside layer 106, and a first side 105 of the die 104 comprises one or more die pads 120. The die backside layer 106 comprises one or more openings 112. Openings 112 may be configured according to any embodiments discussed herein.

A substrate 102 comprises substrate pads 117 each with a conductive interconnect structure 110 (e.g., solder ball) thereupon. In some embodiments, an intermediate layer 103 may be between the die 104 and the backside layer 106. The TCB process 140 may be employed wherein the die 104 may be attached to the substrate 102 (FIG. 2I). The TCB process 140 may utilize compression and temperature to bond the die 104 to the substrate 102, as is known in the art. The depth, dimensions and shapes of the openings 112 may be optimized so that the warpage of the die 104 comprising the die backside layer 106 is minimized during the application of the TCB process 140. The TCB process may be followed by an underfill step (not shown) wherein an underfill material such as one comprising epoxy is used to surround and encapsulate the bonded joints between the die and substrate after TCB. During such TCB, openings 112 mitigate the warping of die 104 and thereby reduce or eliminate failures inclusive of solder bridging and/or joint opens.

Discussion now turns to embodiments related to non-uniform interconnect structures to mitigate such issues during TCB.

Figure 3B:
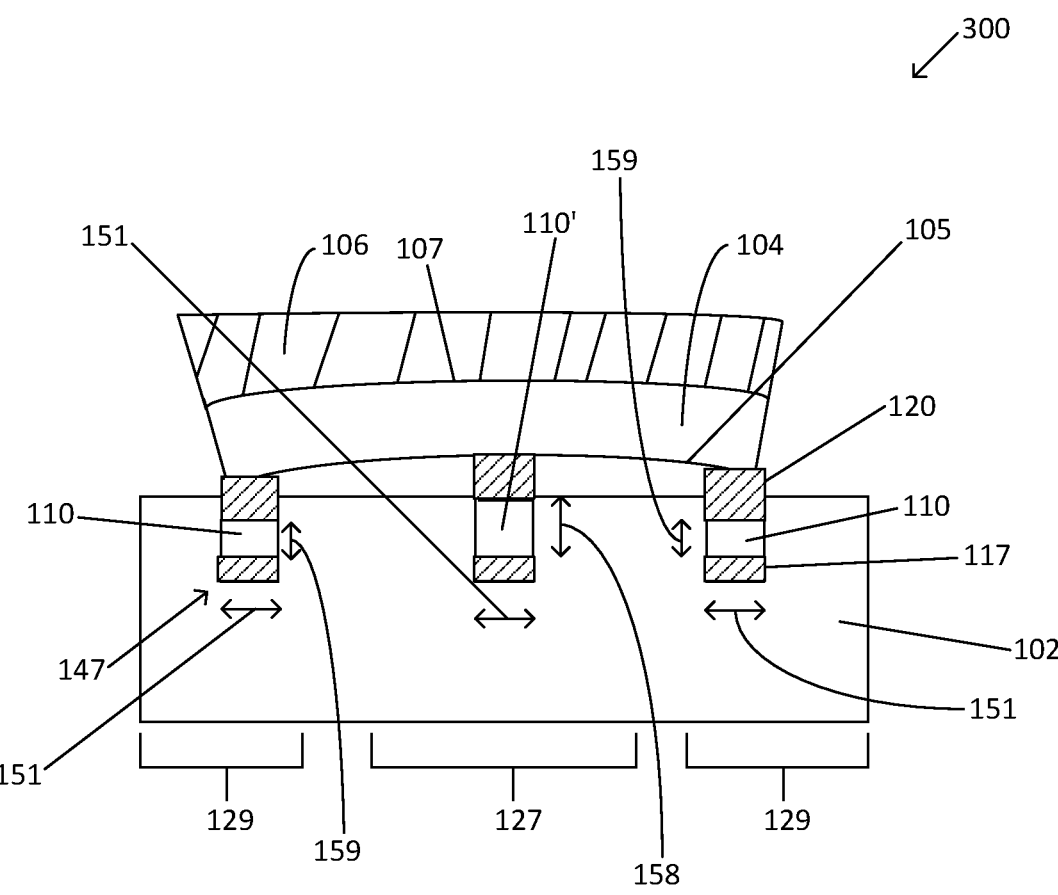

FIGS. 3A-3D depict microelectronic package structures comprising non-uniform interconnect structures that may be optimized to reduce or eliminate warpage according to some embodiments. FIG. 3A depicts a cross-sectional view of a package substrate structure 300 comprising a die 104 over a substrate 102. The die 104 comprises a first side 105 and a second side 107, wherein a die backside layer 106 is on the second side 107 and one or more die pads 120 are on the first side 105. The substrate 102 comprises a central region 127 and a peripheral region 129. A first solder resist opening 145 may be located in a peripheral region 129 of the substrate 102. The first solder resist opening 145 may have a first width 149. A second solder resist opening 147 may be located in the central region 127 of the substrate 102 and may have a second width 151.

Solder material 110 may be within the first and second solder resist openings 145, 147. Because the first solder resist opening 145 comprises a first width 149 which is greater than the second width 151 of the second solder resist opening 147, a first height 152 of the solder material 110 within the first solder resist opening 145 may be less than a second height 153 of the solder material 110 within the second solder resist opening 147.

By using different widths/sizes of solder resist openings in peripheral regions 129 versus central regions 127 of the substrate 102, solder bump 110 height can be controlled between the two regions 127, 129. In some embodiments, because solder resist openings 145 in peripheral regions 129 have greater widths than solder resist openings 147 in central regions 127, the solder bumps 110 in the peripheral region 129 of the substrate 102 can accommodate more collapse than the solder bumps in the central region 127 due to die 104 warpage effects during a TCB process, without experiencing solder bridging. In some embodiments, the same solder volume may be deposited on both regions 127, 129 of the substrate 102. In some embodiments, the solder nay be dispensed on the substrate utilizing a paste printing, or a ball dropping process, as are known in the art.

FIG. 3B depicts a cross-sectional view of a package substrate structure 300 comprising a die 104 over a substrate 102, according to some embodiments. The die 104 comprises a first side 105 and a second side 107, wherein a die backside layer 106 is on the second side 107 and one or more die pads 120 are on the first side 105. The substrate 102 comprises a central region 127 and peripheral regions 129. Solder resist openings 147 may comprise substantially the same widths 151 in peripheral regions 129 as in the central region 127 of the substrate 102, however volumes of solder 110' in the central region 127 of the substrate 102 are greater than volumes of solder 110 in the peripheral regions 129 of the substrate 102, leading to larger heights 158 of solder 110' in the central region 127 compared to heights 159 of solder 110 in the peripheral regions 129.

In some embodiments, different volumes of solder may be achieved by using larger sized solder balls in the center region 127 of the substrate and using smaller sized solder balls in the peripheral regions 129 of the substrate 102. By utilizing larger solder 110' volumes in the center region 127 of the substrate 102 and smaller solder 110 volumes in the peripheral regions 129, if the die 104 warps during a TCB process, the solder bumps 110, 110' can accommodate this warpage due to their differing heights, and successful bonding can be achieved without the risks of either solder bridging in peripheral regions 129 or solder opens in the central region 127.

Figure 3C:
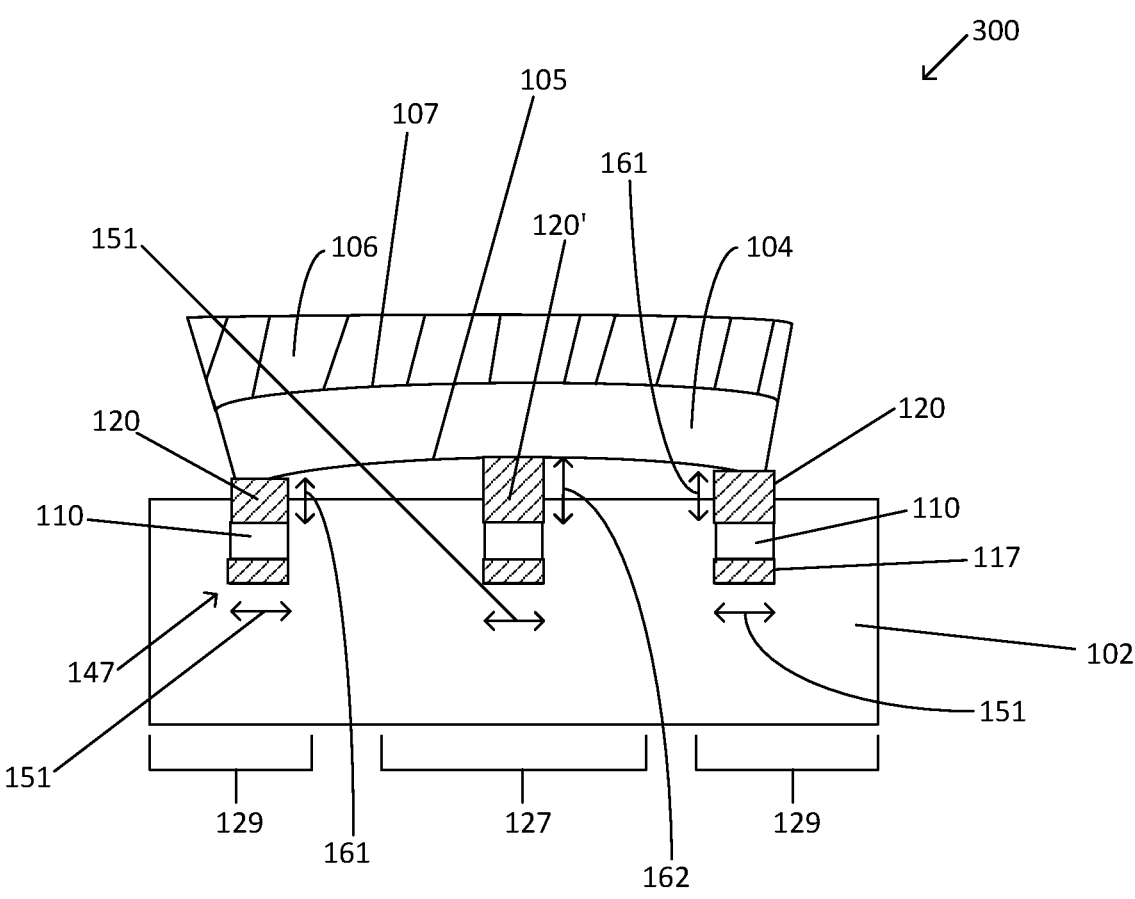

FIG. 3C depicts a cross-sectional view of a package substrate structure 300 comprising a die 104 over a substrate 102, according to some embodiments. The die 104 comprises a first side 105 and a second side 107, wherein a die backside layer 106 is on the second side 107 and one or more die pads 120 are on the first side 105. The substrate 102 comprises a central region 127 and peripheral regions 129.

Solder resist openings 147 may comprise substantially the same widths 151 in peripheral regions 129 as in the central region 129 of the substrate 102. A height 162 of die pads 120' in the region of the die above the central region 127 of the substrate 102 is greater than a height 161 of die pads 120 in the region of the die above the peripheral regions 129 of the substrate 102. This height difference enables successful bonding of the die to the substrate while minimizing the risks of solder bump bridging at peripheral regions 129 or solder opens in the central region 127 during TCB processing.

Figure 3D:
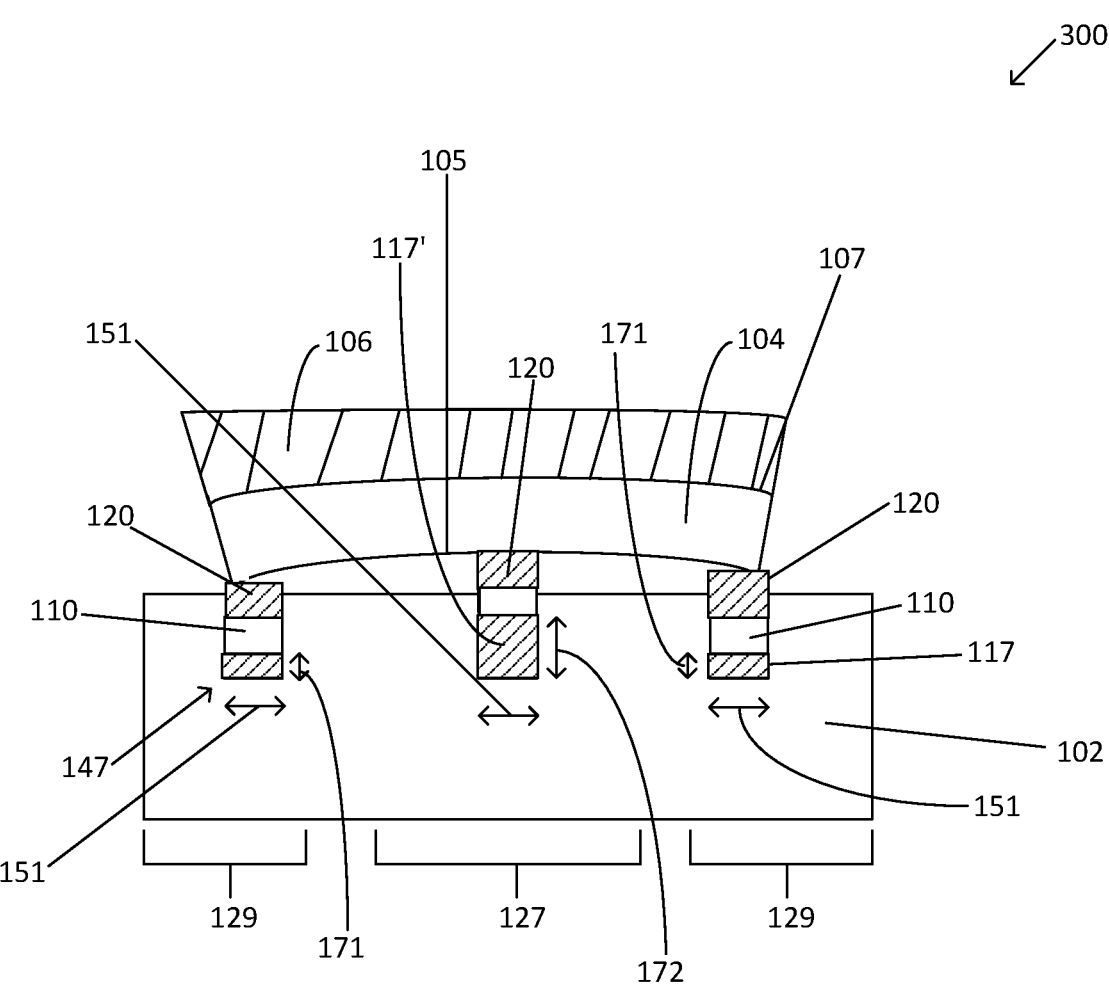

FIG. 3D depicts a cross-sectional view of a package substrate structure 300 comprising a die 104 over a substrate 102, according to some embodiments. The die 104 comprises a first side 105 and a second side 107, wherein a die backside layer 106 is on the second side 107 and one or more die pads 120 are on the first side 105. The substrate 102 comprises a central region 127 and peripheral regions 129. Solder resist openings 147 may comprise substantially the same widths 151 in peripheral regions 129 as in the central region 127 of the substrate 102. A height 172 of substrate pads 117' in the central region 127 of the substrate 102 is greater than a height 171 of substrate pads 117 in the peripheral regions 129 of the substrate 102. This height difference between substrate pads 117, 117' enables successful bonding of the die to the substrate while minimizing the risks of solder bump bridging at peripheral regions 129 or solder opens in the central region 127 of the substrate 102 during TCB processing.

The embodiments herein enable improved TCB processing of dies comprising thick die backside layers and improve product performance. The embodiments herein improve assembly yield by reducing solder bump bridging defects or solder opens during assembly of dies with thick die backside layers.

Discussion now turns to operations for assembling and/or fabricating the discussed structures.

FIG. 4 is a flow chart of a process 400 of fabricating a microelectronic die package structure according to some embodiments. For example, process 400 may be used to fabricate any of the microelectronic die package structures of FIGS. 1A-1F.

As set forth in block 402, a substrate such as a package substrate is received for processing such that the package substrate includes interconnect structures on a surface thereof. The package substrate may be any substrate discussed herein having any number and layout of interconnect structures (e.g., solder balls). For example, one or more conductive interconnect structures may be formed on a surface of a substrate.

As set forth in block 404, one or more support features are formed on one or more peripheral regions of the surface of the substrate, adjacent to one or more conductive interconnect structures on the surface of the substrate. The support features may be any support features discussed herein such as polymeric or composite dielectric support features or engineered solder balls having stiff metal cores, as discussed herein. Furthermore, the support features may be located at any position(s) on the surface of the substrate such as peripheral and corner regions.

As set forth in block 406, a first side of a die is placed on the one or more conductive structures and on the one or more support structures. The first side of the die includes bond pads or similar structures to couple to the conductive structures on the surface of the substrate. Furthermore, the die includes a die backside layer on a second side (e.g., back side) of the die, opposite the first side.

As set forth in block 408, the die is bonded to the substrate to couple the conductive interconnect structures to the front side of the die (e.g., via the bond pads or similar structures). In some embodiments, a TCB process may be employed to bond the die to the substrate. During such thermal compression bonding, due to the discussed CTE mismatch between the die and the die backside layer, the die may tend to warp, which is mitigated by the support features, which provide mechanical support for improved bonding. Notably, the support features counteract some or all such tendency of the die to warp and thereby reduce or eliminate excessive solder collapse. Processing may continue with surface mounting of the package comprising the bonded die/substrate to a board such as a printed circuit board or motherboard with the advantageous die backside layer providing heat dissipation and warpage control of the assembled package.

Figure 5:
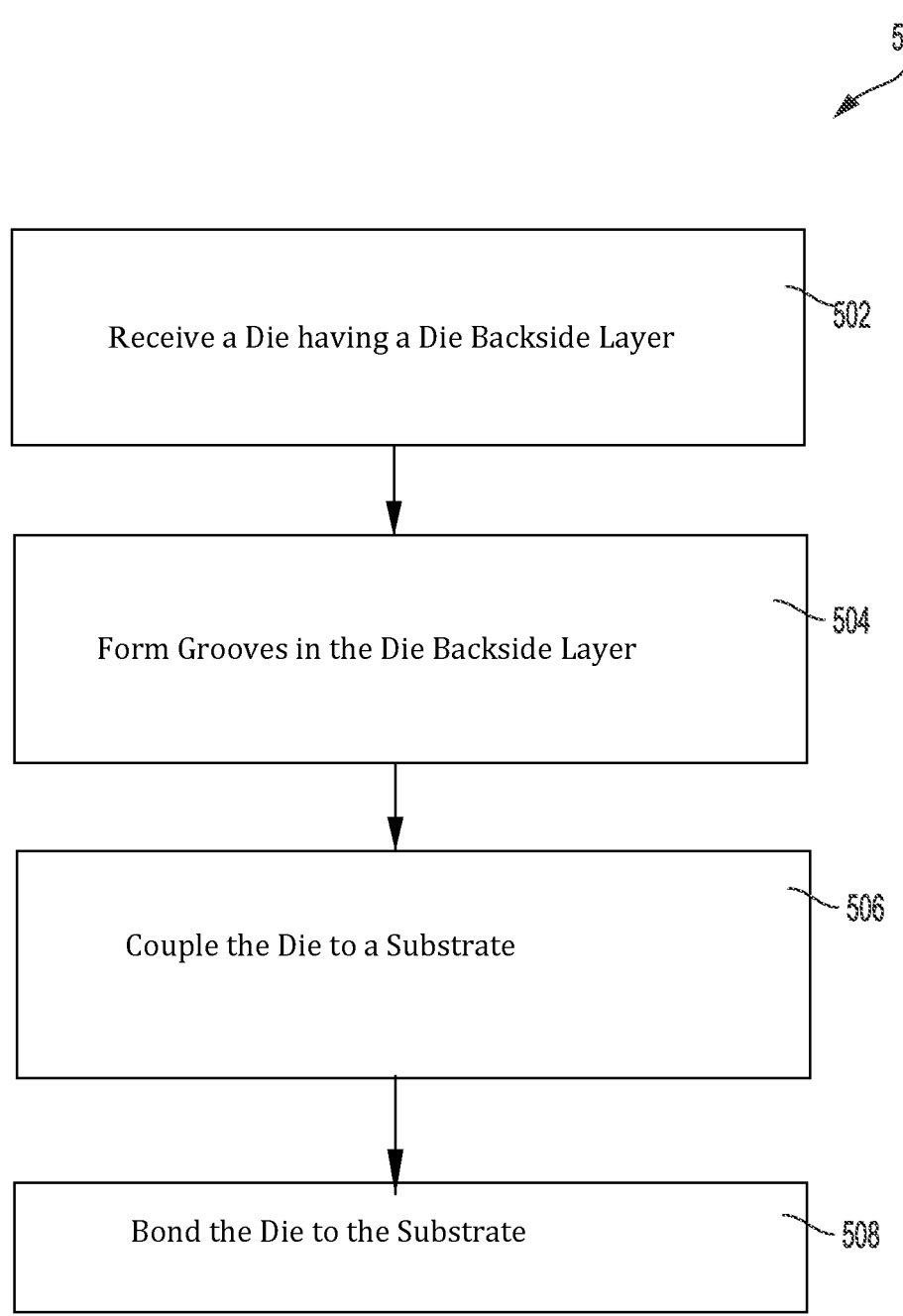
FIG. 5 illustrates a flow chart of a process that includes forming microelectronic package structures comprising die backside layer openings, in accordance with some embodiments.

FIG. 5 is a flow chart of a process 500 of fabricating a microelectronic die package structure according to some embodiments. For example, process 500 may be used to fabricate any of the microelectronic die package structures of FIGS. 2A-2I.

As set forth in block 502, a die is received for processing such that the die has a first side (i.e., front side) and a second side (i.e., back side), and a die backside layer is on the second side of the die.

As set forth in block 504, a plurality of unfilled grooves may be formed in the die backside layer. For example, each of the unfilled grooves may include an opening at a surface of the die backside layer opposite the second side of the die and extending at least partially through the die backside layer. The openings or grooves may have any layout discussed herein. The openings or grooves may extend partially through the die backside layer or they may extend fully through the die backside layer. In some embodiments, the openings or grooves extend fully through the die backside layer and partially or fully through an intermediate layer between the die backside layer and the die. In some embodiments, a distance between each of the plurality of unfilled grooves is substantially the same.

As set forth in block 506, the first side of the die may be coupled or attached to a substrate. The substrate may include conductive interconnect structures (e.g., solder balls) on a surface of the substrate, which are mated with die conductive features on the first side of the die.

As set forth in block 508, the die may be bonded to the substrate to couple the conductive interconnect structures of the substrate to the front side of the die (e.g., via the die conductive features, bond pads or similar structures) In some embodiments, a TCB process may be employed to bond the die to the substrate. During such thermal compression bonding, due to the discussed CTE mismatch between the die and the die backside layer, the die may tend to warp, which is mitigated by the grooves or openings formed at operation 504. Processing may continue with surface mounting of the package comprising the bonded die/substrate to a board such as a printed circuit board or motherboard with the advantageous die backside layer providing heat dissipation and warpage control of the assembled package.

Figure 6:
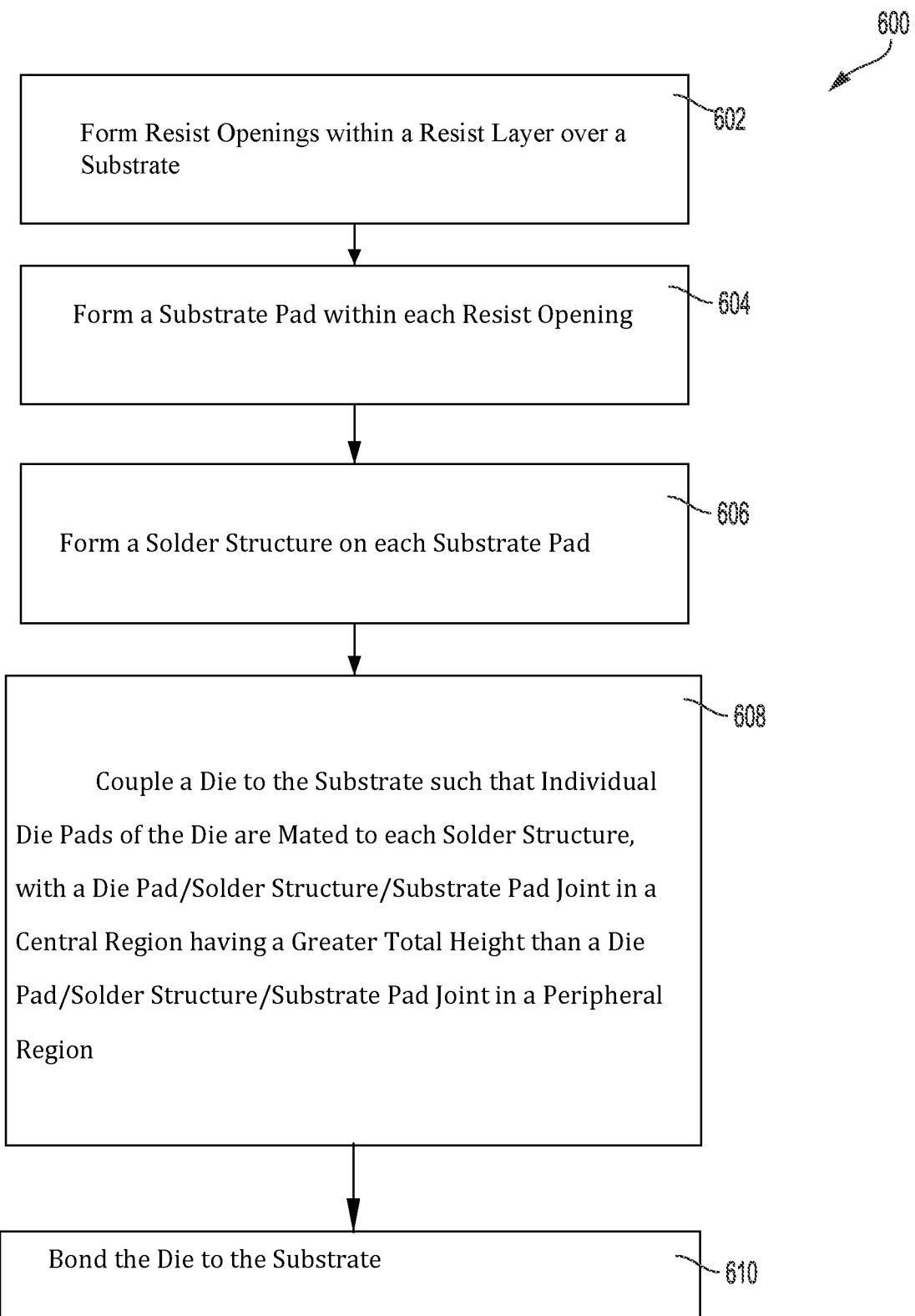
FIG. 6 illustrates a flow chart of a process that includes forming microelectronic package structures comprising non-uniform structures, in accordance with some embodiments.

FIG. 6 is a flow chart of a process 600 of fabricating a microelectronic die package structure according to some embodiments. For example, process 600 may be used to fabricate any of the microelectronic die package structures of FIGS. 3A-3D.

As set forth in block 602, one or more substrate resist openings may be formed within a substrate. The substrate resist openings may be formed using any suitable technique or techniques such as resist patterning techniques inclusive of dry film resist patterning techniques.

As set forth in block 604, a substrate pad is formed within each substrate resist opening. In some embodiments, the substrate pads are formed using deposition and/or patterning techniques.

As set forth in block 606, a solder structure may be formed on each substrate pad. The solder structure may be formed using any suitable technique or techniques such as stenciling or masking techniques or the like.

As set forth in block 608, a die may be attached to the substrate, wherein individual die pads on a surface of the die are mated to each solder structure, and wherein the total height of a joint comprising the die pad, solder structure, and substrate pad in a central region of the substrate is greater than the total height of a joint comprising a die pad, solder structure, and substrate pad located in a peripheral region of the substrate.

As set forth in block 610, the die is bonded to the substrate to couple the conductive interconnect structures to the front side of the die (e.g., via the bond pads or similar structures). In some embodiments, the die is thermally and compressively bonded to the substrate as set forth in block 610. During such thermal compression bonding, due to the discussed CTE mismatch between the die and the die backside layer, the die may tend to warp, which is mitigated by the joint heights being greater in the central region than in the peripheral region. Processing may continue with surface mounting of the package comprising the bonded die/substrate to a board such as a printed circuit board or motherboard with the advantageous die backside layer providing heat dissipation and warpage control of the assembled package.

Figure 7:
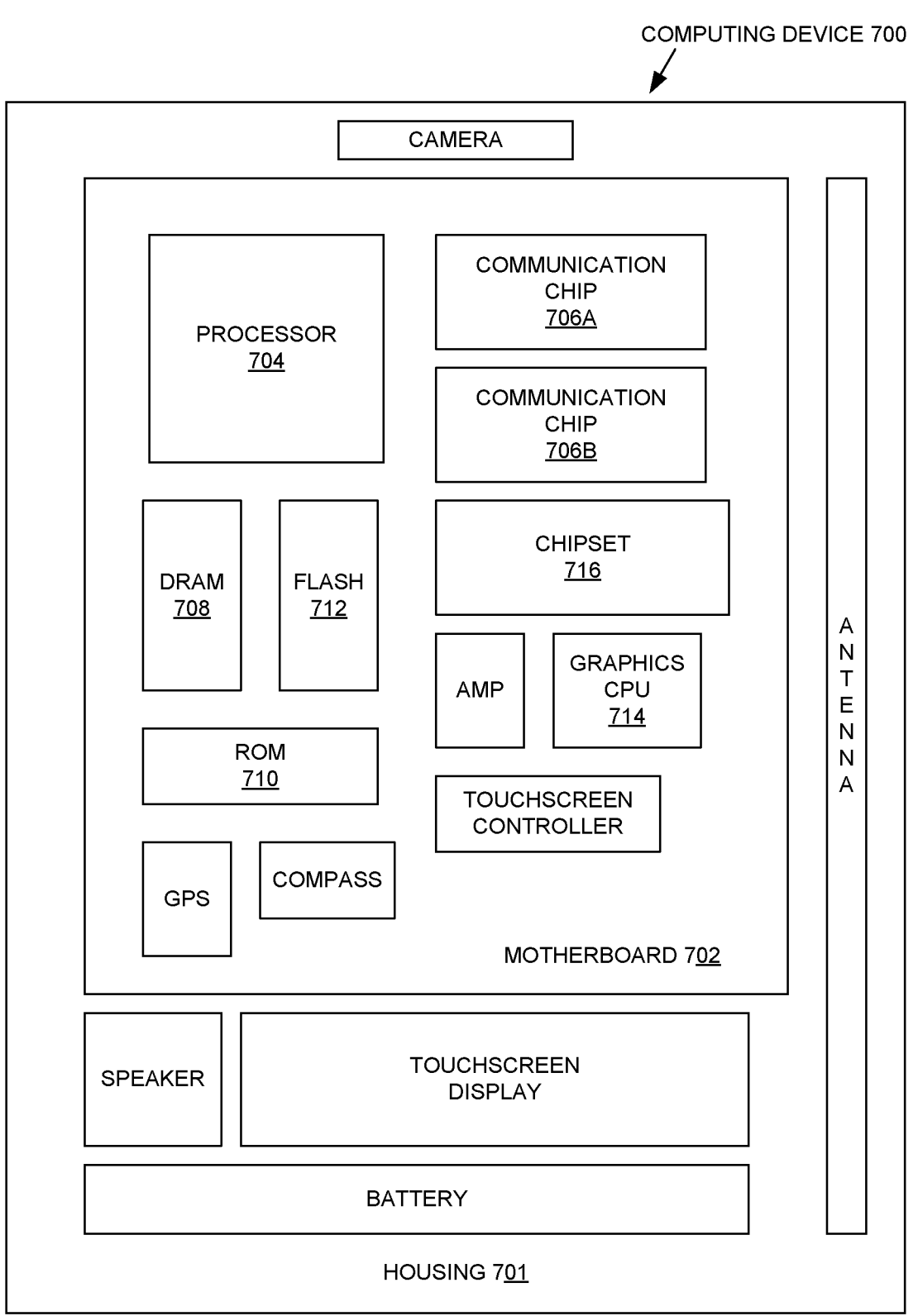
FIG. 7 is a functional block diagram of an electronic computing device, in accordance with some embodiments of the present disclosure.

FIG. 7 illustrates an electronic or computing device 700 in accordance with one or more implementations of the present description. The computing device 700 may include a housing 701 having a board 702 disposed therein. The computing device 700 may include a number of integrated circuit components, including but not limited to a processor 704, at least one communication chip 706A, 706B, volatile memory 708 (e.g., DRAM), non-volatile memory 710 (e.g., ROM), flash memory 712, a graphics processor or CPU 714, a digital signal processor (not shown), a crypto processor (not shown), a chipset 716, an antenna, a display (touch-screen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 702. In some implementations, at least one of the integrated circuit components may be a part of the processor 704.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an electronic substrate having a die having a first side and a second side. The first side of the die is coupled to the substrate, and a die backside layer is on the second side of the die. The die backside layer includes a plurality of unfilled grooves in the die backside layer. Each of the unfilled grooves has an opening at a surface of the die backside layer, opposite the second side of the die, and extends at least partially through the die backside layer.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure. It is understood that the subject matter of the present description is not necessarily limited to specific applications illustrated in FIGS. 1-7. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein a first example is a substrate, a die comprising a first side and a second side, wherein the first side of the die is coupled to the substrate; and a die backside layer on the second side of the die, wherein the die backside layer comprises a plurality of unfilled grooves in the die backside layer, each of the unfilled grooves comprising an opening at a surface of the die backside layer opposite the second side of the die and extending at least partially through the die backside layer.

In second examples, the first example can optionally include wherein at least one of the unfilled grooves does not extend completely through the die backside layer.

In third examples, for any of the first examples wherein at least one of the unfilled grooves extends completely through the die backside layer.

In fourth examples, for any of the first examples wherein a distance between each of the plurality of unfilled grooves is substantially the same.

In fifth examples, for any of the first examples wherein the unfilled grooves extend across at least one of a length or a width of the die backside layer, and wherein the unfilled grooves comprise a uniform depth and a uniform width.

In sixth examples, for any of the first examples wherein the die backside layer comprises at least one of copper, aluminum, silver, gold, nickel, diamond, aluminum nitride, silicon carbide, or combinations thereof.

In seventh examples, for any of the first examples further comprising an intermediate layer between the die backside layer and the second side of the die, wherein the intermediate layer comprises at least one of titanium, nickel, vanadium, gold, or nitrogen, and wherein the intermediate layer comprises a thickness of wherein at least one of the unfilled grooves extends through the die backside layer and the intermediate layer 10 nm to 500 nm.

In eighth examples, for the seventh example wherein at least one of the unfilled grooves extends through the die backside layer and the intermediate layer.

In ninth examples, for any of the first examples wherein the die backside layer comprises a thickness between 50 microns and 500 microns.

In tenth examples, for any of the first examples wherein a series of concentric unfilled grooves extend at least partially within the die backside layer.

In eleventh examples, a computer system comprising a power supply, one or more integrated circuit packages coupled to the power supply, wherein at least one of the integrated circuit packages comprises a substrate comprising a surface, one or more conductive interconnect structures on the surface of the substrate, a die comprising a first side and a second side, wherein the first side of the die is coupled to the one or more conductive interconnect structures, and a die backside layer on the second side of the die, wherein the die backside layer comprises one or more unfilled grooves comprising an opening at a surface of the die backside layer opposite the second side of the die and extending at least partially through the die backside layer.

In twelfth examples, for any of the eleventh examples wherein a thickness of the die backside layer is between 50 microns to 500 microns.

In thirteenth examples, for any of the eleventh examples wherein a series of concentric unfilled grooves extend at least partially within the die backside layer.

In fourteenth examples, for any of the thirteenth examples further comprising an intermediate layer between the die backside layer and the second side of the die, wherein the series of concentric unfilled grooves extends completely through the die backside layer and completely through the intermediate layer.

In fifteenth examples, for any of the eleventh examples wherein a length of the one or more openings is the same as at least one of a length of the die or a width of the die.

In sixteenth examples, a method of fabricating a microelectronic package structure, the method comprising receiving a die comprising a first side and a second side, wherein a first side of a die backside layer is on the second side of the die, forming one or more unfilled grooves in a second side of the die backside layer, each of the unfilled grooves comprising an opening at a surface of the die backside layer opposite the second side of the die and extending at least partially through the die backside layer, attaching the first side of the die to a substrate, wherein substrate pads on the surface of the substrate are mated with die pads on the first side of the die, and bonding the die to the substrate.

In seventeenth examples, for any of the sixteenth examples wherein the die backside layer comprising a thickness between 50 microns and 500 microns.

In eighteenth examples, for any of the sixteenth examples wherein bonding the die to the substrate comprises thermally and compressively bonding the die to the substrate.

In nineteenth examples for any of the sixteenth examples wherein the die backside layer comprises at least one of copper, aluminum, silver, gold, nickel, diamond, aluminum nitride, silicon carbide or combinations thereof.

In twentieth examples for any of the sixteenth examples wherein forming the one or more unfilled grooves comprises forming a length of the one or more unfilled grooves that is substantially the same as at least one of a length of the die or a width of the die.

It will be recognized that principles of the disclosure are not limited to the embodiments so described but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A microelectronic die package structure comprising:
a substrate;
a die comprising a first side and a second side, wherein the first side of the die is coupled to the substrate; and
a die backside layer on the second side of the die, wherein the die backside layer comprises a plurality of unfilled grooves in the die backside layer, each of the unfilled grooves comprising an opening at a surface of the die backside layer opposite the second side of the die and extending at least partially through the die backside layer, wherein at least one of the unfilled grooves extends completely through the die backside layer.

2. The microelectronic die package structure of claim 1, wherein at least one of the unfilled grooves does not extend completely through the die backside layer.

3. The microelectronic die package structure of claim 1, wherein a distance between each of the plurality of unfilled grooves is substantially the same.

4. The microelectronic die package structure of claim 3, wherein the unfilled grooves extend across at least one of a length or a width of the die backside layer, and wherein the unfilled grooves comprise a uniform depth and a uniform width.

5. The microelectronic die package structure of claim 1, wherein the die backside layer comprises at least one of copper, aluminum, silver, gold, nickel, diamond, aluminum nitride, silicon carbide, or combinations thereof.

6. The microelectronic die package structure of claim 1, further comprising: an intermediate layer between the die backside layer and the second side of the die, wherein the intermediate layer comprises at least one of titanium, nickel, vanadium, gold, or nitrogen, and wherein the intermediate layer comprises a thickness of between 10 nm to 500 nm.

7. The microelectronic die package structure of claim 6, wherein at least one of the unfilled grooves extends through the die backside layer and the intermediate layer.

8. The microelectronic die package structure of claim 1, wherein the die backside layer comprises a thickness between 50 microns and 500 microns.

9. The microelectronic die package structure of claim 1, wherein a series of concentric unfilled grooves extend at least partially within the die backside layer.

10. A computer system comprising;

a power supply;

one or more integrated circuit packages coupled to the power supply, wherein at least one of the integrated circuit packages comprises:

a substrate comprising a surface;

one or more conductive interconnect structures on the surface of the substrate;

a die comprising a first side and a second side, wherein the first side of the die is coupled to the one or more conductive interconnect structures; and a die backside layer on the second side of the die, wherein the die backside layer comprises one or more unfilled grooves comprising an opening at a surface of the die backside layer opposite the second side of the die and extending at least partially through the die backside layer, wherein a length of the opening is the same as at least one of a length of the die or a width of the die.

11. The computer system of claim 10, wherein a thickness of the die backside layer is between 50 microns to 500 microns.

12. The computer system of claim 10, wherein a series of concentric unfilled grooves extend at least partially within the die backside layer.

13. The computer system of claim 12, further comprising an intermediate layer between the die backside layer and the second side of the die, wherein the series of concentric unfilled grooves extends completely through the die backside layer and completely through the intermediate layer.

* * * * *